United States Patent
Lee et al.

(10) Patent No.: US 8,471,275 B2
(45) Date of Patent: Jun. 25, 2013

(54) ORGANIC LIGHT EMITTING DEVICE DISPLAY AND METHOD OF MANUFACTURING THE SAME

(75) Inventors: Sang-Pil Lee, Yongin (KR); Young-Rok Song, Yongin (KR); Jung-Bae Song, Yongin (KR); Beohm-Rock Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 78 days.

(21) Appl. No.: 12/929,459

(22) Filed: Jan. 26, 2011

(65) Prior Publication Data

US 2011/0180825 A1  Jul. 28, 2011

(30) Foreign Application Priority Data

Jan. 27, 2010  (KR) .................. 10-2010-0007444

(51) Int. Cl.
*H01L 51/52* (2006.01)
*H01L 51/56* (2006.01)

(52) U.S. Cl.
USPC .......... 257/89; 257/40; 257/E51.022; 438/35; 438/99

(58) Field of Classification Search
CPC .................. H01L 51/504; H01L 51/5044
USPC ............. 257/40, 89, 103, E51.022, E33.069; 313/504; 438/35, 99
See application file for complete search history.

(56) References Cited

U.S. PATENT DOCUMENTS

| | | | |
|---|---|---|---|
| 6,627,333 | B2 | 9/2003 | Hatwar |
| 2005/0142976 | A1 | 6/2005 | Suzuki |
| 2005/0249972 | A1* | 11/2005 | Hatwar et al. ............... 428/690 |
| 2006/0017377 | A1 | 1/2006 | Ryu |
| 2008/0018239 | A1 | 1/2008 | Matsuda et al. |
| 2008/0284324 | A1 | 11/2008 | Chun et al. |
| 2009/0231243 | A1 | 9/2009 | Song |

FOREIGN PATENT DOCUMENTS

| | | |
|---|---|---|
| JP | 2005-197010 A | 7/2005 |
| JP | 2008-027722 A | 2/2008 |
| JP | 2008-288201 A | 11/2008 |
| JP | 2009/064703 A | 3/2009 |
| JP | 2009-224781 | 10/2009 |
| KR | 10 2007-0078501 A | 8/2007 |
| KR | 10-0829761 B1 | 5/2008 |

* cited by examiner

*Primary Examiner* — Jerome Jackson, Jr.
*Assistant Examiner* — Yu Chen
(74) *Attorney, Agent, or Firm* — Lee & Morse, P.C.

(57) ABSTRACT

An organic light emitting device display, including a first electrode in red, green, and blue sub-pixels on a substrate, a hole injection layer above the substrate so as to cover the first electrode, a hole transport layer above the hole injection layer, an auxiliary layer between the hole injection layer and the hole transport layer in the red sub-pixel, a red light emission layer and a green light emission layer above the hole transport layer in the red sub-pixel and the green sub-pixel, the red light emission layer being between the green light emission layer and the hole transport layer, and a blue light emission layer above the hole transport layer in the blue sub-pixel.

14 Claims, 4 Drawing Sheets

(a)

(b)

(c)

(d)

ORGANIC LIGHT EMITTING DEVICE DISPLAY AND METHOD OF MANUFACTURING THE SAME

BACKGROUND

1. Field

Embodiments relate to an organic light emitting device display and a method of manufacturing the same.

2. Description of the Related Art

In general, an organic light emitting diode (OLED) has a structure in which an organic light emission layer, formed as a functional thin film, is disposed between an anode electrode and a cathode electrode. In operation, holes are inserted via the anode electrode and electrons are inserted via the cathode electrode, and then the electrons and the holes are combined with each other in the organic light emission layer, so that excitons are formed in the organic light emission layer and emit light when the electrons and holes recombine with each other.

In a full-color OLED display, an independent light emission method, a color filter method, a color conversion method, or the like may be used. In the independent light emission method, each of red (R), green (G), and blue (B) light emitting materials are thermally depositing by using a metal shadow mask having an elaborate pattern so as to realize R, G, and B colors. In the color filter method, a white light emission layer is formed and then R, G, and B color filters are patterned so as to realize R, G, and B colors. In the color conversion method, a blue light emission layer is formed, and then a color conversion layer is used for converting a blue color into green and red colors so as to realize R, G, and B colors.

SUMMARY

It is a feature of an embodiment to provide an organic light emitting device display and a method of manufacturing the organic light emitting device display having improved lifetime characteristic and light emission efficiency while reducing the number of times of changing a fine metal mask (FMM) during manufacture.

At least one of the above and other features and advantages may be realized by providing an organic light emitting device display, including a first electrode in red, green, and blue sub-pixels on a substrate, a hole injection layer above the substrate so as to cover the first electrode, a hole transport layer above the hole injection layer, an auxiliary layer between the hole injection layer and the hole transport layer in the red sub-pixel, a red light emission layer and a green light emission layer above the hole transport layer in the red sub-pixel and the green sub-pixel, the red light emission layer being between the green light emission layer and the hole transport layer, and a blue light emission layer above the hole transport layer in the blue sub-pixel.

The red light emission layer may have a hole transport ability, and the green light emission layer may have an electron transport ability.

The auxiliary layer may have a hole transport ability.

The auxiliary layer may include the same material as the hole transport layer.

The thickness of the auxiliary layer may be between about 300 Å and about 1,500 Å.

The thickness of the red light emission layer may be between about 500 Å and about 2,000 Å, and the thickness of the green light emission layer may be between about 100 Å and about 1,000 Å.

The blue light emission layer may be on the green light emission layer whereby the blue light emission layer is common to at least the blue sub-pixel and the green sub-pixel.

The thickness of the blue light emission layer may be between about 100 Å and about 500 Å.

At least one of the above and other features and advantages may also be realized by providing a method of manufacturing an organic light emitting device display, the method including forming a first electrode for each of red, green, and blue sub-pixels on a substrate, forming a hole injection layer above the substrate so as to cover the first electrode, forming an auxiliary layer above the hole injection layer in the red sub-pixel, forming a hole transport layer above the hole injection layer so as to cover the auxiliary layer, and sequentially forming a red light emission layer and a green light emission layer above the hole transport layer in the red sub-pixel and the green sub-pixel.

The red light emission layer may have a hole transport ability, and the green light emission layer may have an electron transport ability.

The auxiliary layer may have a hole transport ability.

The auxiliary layer may include the same material as the hole transport layer.

The thickness of the auxiliary layer may be between about 300 Å and about 1,500 Å.

The thickness of the red light emission layer may be between about 500 Å and about 2,000 Å, and the thickness of the green light emission layer may be between about 100 Å and about 1,000 Å.

The method may further include forming a blue light emission layer on the hole transport layer in the blue sub-pixel.

The blue light emission layer may be formed by being patterned by using a fine metal mask.

The method may further include forming a blue light emission layer on the green light emission layer and the hole transport layer so as to form the blue light emission layer as a common layer above a front surface of the substrate.

The thickness of the blue light emission layer may be between about 100 Å and about 500 Å.

The auxiliary layer, the red light emission layer, and the green light emission layer may be formed by being patterned by using a fine metal mask.

The blue light emission layer may be formed by being patterned by using an open mask.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
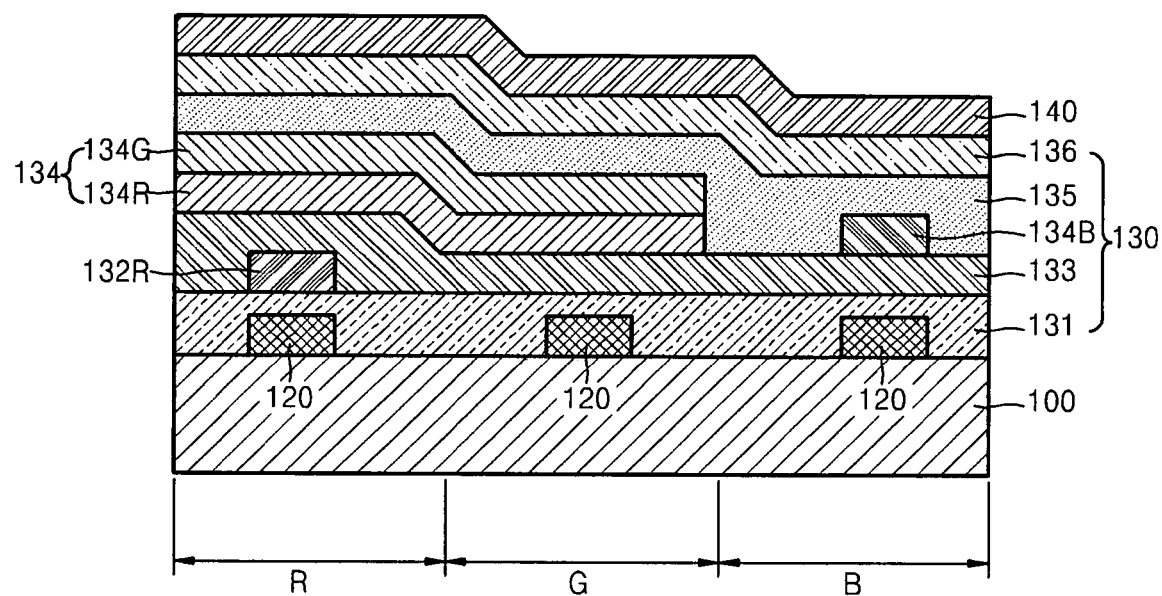
FIG. 1 illustrates a cross-sectional view of an organic light emitting device display according to a first example embodiment.

Korean Patent Application No. 10-2010-0007444, filed on Jan. 27, 2010, in the Korean Intellectual Property Office, and entitled: "Organic Light Emitting Diode Display Apparatus and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the following description, well-known functions or constructions are not described in detail since they would obscure the invention with unnecessary detail.

Also, when a part "includes" or "comprises" an element, unless there is a particular description contrary thereto, the part can further include other elements, not excluding the other elements. As used herein, the term "and/or" includes any and all combinations of one or more of the associated listed items.

FIG. 1 illustrates a cross-sectional view of an organic light emitting device display according to a first example embodiment.

In the first example embodiment shown in FIG. 1, an OLED display includes a substrate 100, and red (R), green (G), and blue (B) sub-pixel regions that are formed on the substrate 100.

The substrate 100 may be formed of, e.g., a transparent glass material, a plastic material, or a metal foil. The substrate 100 may have good mechanical strength, thermal stability, transparency, surface smoothness, easy usage, and waterproofness, as generally used in an OLED display. Although not illustrated in FIG. 1, each of the R, G, and B sub-pixels of the substrate 100 may include at least one thin film transistor (TFT) and/or capacitor, and a pixel circuit may be embodied by using the TFT and the capacitor.

A first electrode 120 and a second electrode 140 may be arranged above the substrate 100 so as to face each other. The first electrode 120 may be patterned for each of the R, G, and B sub-pixels, and may be an anode electrode or a cathode electrode. The second electrode 140 corresponds to the first electrode 120, and may be a cathode electrode or an anode electrode. The second electrode 140 may be formed on an electron injection, layer 136 by performing, e.g., a vacuum evaporation operation or a sputtering operation.

The OLED display including an OLED may be implemented as a bottom emission type OLED display in which an image is realized toward the substrate 100. In this case, the first electrode 120 may be a transparent electrode and the second electrode 140 may be a reflective electrode. The first electrode 120 may be formed of a material having a high work function such as Indium Tin Oxide (ITO), Indium Zinc Oxide (IZO), zinc oxide (ZnO) or Indium Oxide ($In_2O_3$), and the second electrode 140 may be formed of a metal having a low work function such as silver (Ag), magnesium (Mg), aluminum (Al), platinum (Pt), palladium (Pd), gold (Au), nickel (Ni), neodymium (Nd), iridium (Ir), chromium (Cr), lithium (Li), and/or calcium (Ca).

The OLED display including the OLED may be implemented as a top emission type OLED display in which an image is realized toward the second electrode 140. In this case, the first electrode 120 may be a reflective electrode and the second electrode 140 may be a transparent electrode. Here, the reflective electrode corresponding to the first electrode 120 may be formed by a process that includes, e.g., forming a reflective layer of a material such as Ag, Mg, Al, Pt, Pd, Au, Ni, Nd, Ir, Cr, Li, Ca, and/or compounds thereof, and then forming a layer of a material having a high work function such as ITO, IZO, ZnO or $In_2O_3$ on the reflective layer. The transparent electrode corresponding to the second electrode 140 may be formed by a process that includes, e.g., depositing a metal having a low work function such as Ag, Mg, Al, Pt, Pd, Au, Ni, Nd, Ir, Cr, Li, Ca, and/or compounds thereof, and then forming an auxiliary electrode layer or a bus electrode line of a transparent conductive material including a material such as ITO, IZO, ZnO, and/or $In_2O_3$ on the metal.

The OLED display including the OLED may be implemented as a double-side emission type OLED display. In this case, the first electrode 120 and the second electrode 140 may be formed as a transparent electrode.

If the substrate 100 includes a TFT, as described above, the first electrode 120 may be patterned for each of the R, G, and B sub-pixels and electrically connected to a TFT in each of the R, G, and B sub-pixels. In this case, the second electrode 140 may be formed as a common electrode that extends over the R, G, and B sub-pixels so as to cover all the R, G, and B sub-pixels.

If the substrate 100 does not include the TFT for each of the R, G, and B sub-pixels, the first electrode 120 and the second electrode 140 may be patterned as crossing stripe patterns, and thus may perform a passive matrix (PM) drive.

In the first example embodiment shown in FIG. 1, an organic layer 130 is interposed between the first electrode 120 and the second electrode 140, the organic layer 130 including a hole injection layer 131, an auxiliary layer 132R, a hole transport layer 133, a red light emission layer 134R, a green light emission layer 134G, a blue light emission layer 134B, an electron transport layer 135, and the electron injection layer 136, which are sequentially arranged.

Although not illustrated in FIG. 1, a pixel defining layer covering end and side portions of the first electrode 120 may be formed above the first electrode 120. The pixel defining layer may be formed of, e.g., an organic material, an inorganic material, or an organic-inorganic material multi-layer. The inorganic material may be a material such as silicon dioxide ($SiO_2$), silicon nitride ($SiN_x$), and/or silicon oxynitride (SiON). The organic material may be a materials such as an acryl-based organic compound, polyamide, and/or polyimide, which are organic insulating materials.

The hole injection layer 131 may be formed as a common layer with respect to the R, G, and B sub-pixels by using an open mask, wherein the common layer is above the substrate 100 whereon the first electrode 120 is formed. The hole injection layer 131 may have a thickness between about 300 Å and about 800 Å for smooth hole injection, although the thickness thereof may vary according to the materials of other layers. The hole injection layer 131 may include a material such as 4,4′,4″-tris(N-(2-naphthyl)-N-phenyl-amino)-triphenylamine (2-TNATA), copper phthalocyanine (CuPc), tris(4-carbazoyl-9-ylphenyl)amine (TCTA), which is a starburst type amine, 4,4′,4″-tris-(3-methylphenylphenylamino)-triphenylamine (m-MTDATA), and/or IDE406 (manufactured by IDEMITSU KOSAN, LTD.), or another material providing smooth hole injection may be used.

The hole transport layer 133 having high hole mobility and providing smooth hole transport may be formed above the hole injection layer 131. The hole transport layer 133 may be formed as a common layer with respect to the R, G, and B sub-pixels by using an open mask. The thickness of the hole transport layer 133 may be between about 300 Å and about 800 Å, although the thickness thereof may vary according to the materials of other layers. A deposition condition and a coating condition of the hole transport layer 133 may vary according to compounds used. In an example implementation, the deposition condition and the coating condition may be selected similarly as those for the formation of the hole injection layer 131. The material of the hole transport layer 133 may include, e.g., carbazole derivatives including N-phenylcarbazole, polyvinylcarbazole, or the like, 4,4'-bis[N-(1-naphthyl)-N-phenylamino]biphenyl (NPB), N,N'-bis(3-methylphenyl)-N,N-diphenyl-[1,1'-biphenyl]-4,4'-diamine (TPD), N,N'-diphenyl-N,N-bis(1-naphthyl)-1,1 biphenyl-4,4-diamine (α-NPD), IDE320 (manufactured by IDEMITSU KOSAN, LTD.), or the like, etc.

In the first example embodiment shown in FIG. 1, the auxiliary layer 132R is arranged between the hole injection layer 131 and the hole transport layer 133 in the red (R) sub-pixel region. The auxiliary layer 132R may adjust the thickness of an organic layer of the R sub-pixel so as to adjust a resonance period for the red light. The resonance period is adjusted by using a micro-cavity effect. The auxiliary layer 132R may have a thickness between about 300 Å and about 1,500 Å so as to increase a light emission efficiency, a color purity, or the like of the red light. In an implementation, the auxiliary layer 132R may be formed only in the red (R) sub-pixel region by using the FMM. In an implementation, the material of the auxiliary layer 132R may be the same as, or may include, that of the hole transport layer 133.

In the first example embodiment shown in FIG. 1, a light emission layer 134 is formed above the hole transport layer 133. The light emission layer 134 includes the red light emission layer 134R and the green light emission layer 134G that are sequentially stacked in the red (R) and green (G) sub-pixel regions, and the blue light emission layer 134B that is arranged in the blue (B) sub-pixel region. The red light emission layer 134R and the green light emission layer 134G may be commonly arranged in the red (R) and green (G) sub-pixel regions by performing a stacking operation.

The red light emission layer 134R, the green light emission layer 134G, and the blue light emission layer 134B may be formed above the hole transport layer 133 by using the FMM. Here, the red light emission layer 134R and the green light emission layer 134G are sequentially stacked as a common layer in the red (R) and green (G) sub-pixel regions. Thus, a mask having a larger opening may be used so that it is advantageous for a manufacture of a large display panel, compared to a case in which a light emission layer is formed in each sub-pixel. In an implementation, the blue light emission layer 134B may be stacked only in the blue (B) sub-pixel region by using the FMM.

The auxiliary layer 132R may be arranged in the red (R) sub-pixel region so as to adjust the resonance period of the red light, and the red light emission layer 134R may be arranged in the red (R) and green (G) sub-pixel regions so as to adjust a resonance period for a green light. Thus, the red light emission layer 134R may simultaneously function as an emission layer of the red light, and as an auxiliary layer of a green sub-pixel (R). In an implementation, the red light emission layer 134R has a hole transport ability, and the green light emission layer 134G has an electron transport ability.

The red, green, and blue light emission layers 134R, 134G, and 134B may be formed by using various known light emitting materials, and may be formed by using a known host and dopant. The dopant may include a known fluorescent dopant and/or a known phosphorescent dopant. In particular, the red light emission layer 134R may include a host and red dopant, which have great hole transport characteristics, and the green light emission layer 134G may include a host and green dopant, which have great electron transport characteristics.

The host of the light emission layer 134 may include, e.g., aluminum tris(8-hydroxyquinoline (Alq3), 4,4'-di(N-carbazolyl)biphenyl (CBP), distyryl arylene (DSA), GDI1403 that is red phosphorescent host (manufactured by Gracel Co.), or the like.

A dopant content of the light emission layer 134 may be between 0.1 through 20 parts by weight, e.g., between 0.5 through 15 parts by weight, based on 100 parts by weight of a light emission layer forming material (i.e., a total weight of the host and dopant is 100 parts by weight). If the dopant content is less than 0.1 parts by weight, an effect due to adding the dopant may be small, and if the dopant content is greater than 20 parts by weight, concentration extinction such as concentration quenching may be caused on fluorescence and phosphorescence.

In consideration of light emission efficiency, the thickness of the red light emission layer 134R may be between about 500 Å and about 2,000 Å, the thickness of the green light emission layer 134G may be between about 200 Å and about 1,000 Å, and the thickness of the blue light emission layer 134B may be between about 200 Å and about 1,000 Å.

In the first example embodiment shown in FIG. 1, the electron transport layer 135 is formed on the light emission layer 134. The electron transport layer 135 may be formed on the green light emission layer 134G and the blue light emission layer 134B and above a front side of the substrate 100 by using an open mask. The thickness of the electron transport layer 135 may be between about 200 Å and about 500 Å, and may vary according to the materials of other layers. The electron transport layer 135 may facilitate electron transport, thereby allowing efficient electron transport. A material of the electron transport layer 135 may be a material such as a quinoline derivative material including Alq3, 3-(4-biphenylyl)-4-phenyl-5-(4-tert-butylphenyl)-1,2,4-triazole (TAZ), or the like may be used.

In the first example embodiment shown in FIG. 1, the electron injection layer 136 is formed on the electron transport layer 135 and above the front side of the substrate 100. The electron injection layer 136 may be formed by using the open mask. The thickness of the electron injection layer 136 may be between about 5 Å and about 50 Å, and may vary according to the materials of other layers. The electron injection layer 136 may be formed of a material that facilitates the injection of electrons from the second electrode 140, e.g., lithium fluoride (LiF), NaCl, cesium fluoride (CsF), lithium oxide (Li$_2$O), barium oxide (BaO), and/or Liq.

Although not illustrated in FIG. 1, a hole blocking layer may be selectively formed between the light emission layer 134 and the electron transport layer 135 by using a hole blocking layer forming material. The hole blocking layer forming material may provide a hole transport ability and have an ionization potential greater than a light emission compound. Examples of the hole blocking layer forming material include bis(2-methyl-8-quinolinolato)(4-phenylphenolato)aluminum (BAlq), bathocuproine (BCP), N-arylbenzimidazoles trimer (TPBI), or the like.

As described above in connection with the first example embodiment, the red light emission layer 134R and the green light emission layer 134G are commonly stacked in the red (R) and green (G) sub-pixel regions. Thus, it is not necessary to additionally use the FMM so as to form an auxiliary layer in the green (G) sub-pixel region. Accordingly, a manufacturing process may be simplified by using the FMM four times.

Figure 2:
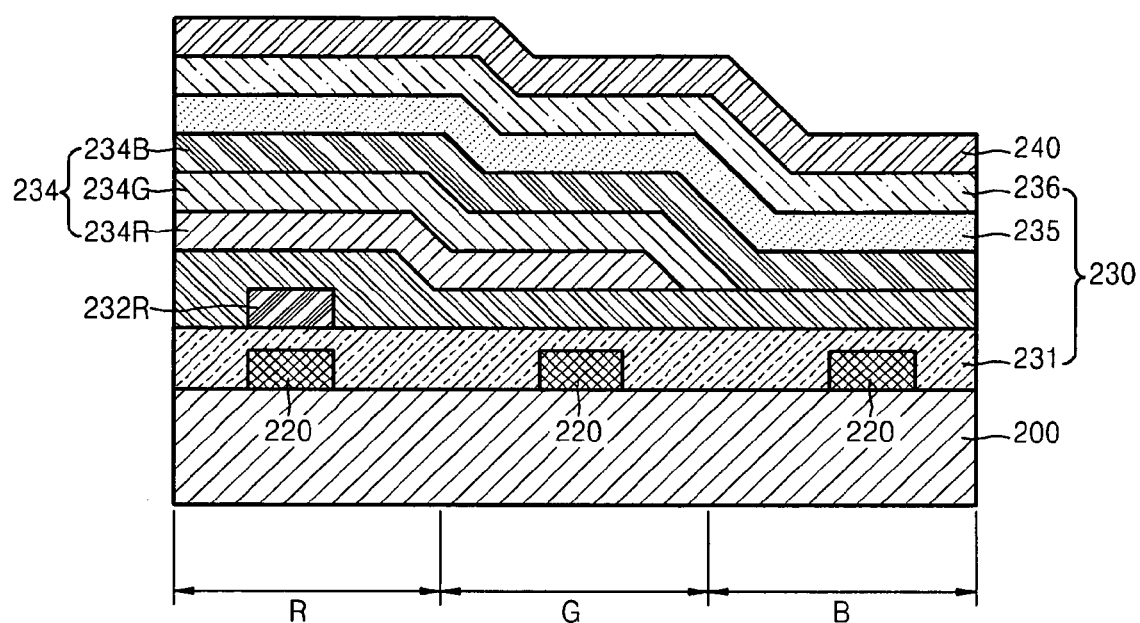
FIG. 2 illustrates a cross-sectional view of an organic light emitting device display according to a second example embodiment.

FIG. 2 illustrates a cross-sectional view of an organic light emitting device display according to a second example embodiment.

Similar to the OLED display of FIG. 1, the OLED display according to the second example embodiment shown in FIG. 2 includes a substrate 200, and red (R), green (G), and blue (B) sub-pixel regions formed on the substrate 200. The OLED display shown in FIG. 2 is different from the OLED display shown in FIG. 1 in that a blue light emission layer 234B is formed as a common layer in FIG. 2. Below, a structure and a detailed description for a manufacturing process with respect to structures that are the same as those in the OLED display of FIG. 1 will be omitted.

In the second example embodiment shown in FIG. 2, a first electrode 220 and a second electrode 240 facing the first electrode 220 are arranged above the substrate 200. An organic layer 230 is interposed between the first electrode 220 and the second electrode 240, the organic layer 230 including a hole injection layer 231, an auxiliary layer 232R, a hole transport layer 233, a red light emission layer 234R, a green light emission layer 234G, the blue light emission layer 234B, an electron transport layer 235, and an electron injection layer 236.

In the second example embodiment shown in FIG. 2, the first electrode 220 is separately formed for each of the red (R), green (G), and blue (B) sub-pixels. Although not illustrated in FIG. 2, a pixel defining layer covering end and side portions of the first electrode 220 may be formed above the first electrode 220. The hole injection layer 231 and the hole transport layer 233 may be sequentially stacked above the first electrode 220 by using an open mask.

In the second example embodiment shown in FIG. 2, the auxiliary layer 232R is arranged between the hole injection layer 231 and the hole transport layer 233 in the red (R) sub-pixel region. The auxiliary layer 232R may adjust a resonance period for a red light. The auxiliary layer 232R may be formed above the hole injection layer 231 by using an FMM.

In the second example embodiment shown in FIG. 2, a light emission layer 234 is formed above the hole transport layer 233. The light emission layer 234 includes the red light emission layer 234R, the green light emission layer 234G, and blue light emission layer 234B.

The red light emission layer 234R may be formed above the hole transport layer 233 by using the FMM in the red (R) and green (G) sub-pixel regions. The green light emission layer 234G may be formed above the red light emission layer 234R by using the FMM in the red (R) and green (G) sub-pixel regions. Thus, the red light emission layer 234R and the green light emission layer 234G may be formed as a common layer in the red (R) and green (G) sub-pixel regions. The red light emission layer 234R may function as a light emission layer in the red (R) sub-pixel region, while functioning as an auxiliary layer and to transport holes in the green (G) sub-pixel region.

In the second example embodiment shown in FIG. 2, the blue light emission layer 234B is formed above the green light emission layer 234G in the red (R) and green (G) sub-pixel regions, and above the hole transport layer 233 in the blue (B) sub-pixel region. The blue light emission layer 234B may be formed as a common layer above a front side of the substrate 200 by using an open mask. The open mask has one opening unit covering more than a light emitting area, such as, an entire panel, whereas a fine metal mask (FMM) has more than one opening units each corresponding to each of sub-pixels, or each corresponding to more than two sub-pixels. When using a FMM, colors may be formed in at least one deposition process. Thus, when the blue light emission layer 234B is manufactured, since the open mask having a larger opening may be used instead of the FMM, the number of times of using the FMM may be reduced to three times as compared to the OLED display of FIG. 1, so that the manufacturing process may be further simplified. The blue light emission layer 234B may have a thickness between about 100 Å and about 500 Å. The thickness of the red light emission layer 234R may be between about 500 Å and about 2,000 Å, and the thickness of the green light emission layer 234G may be between about 200 Å and about 1,000 Å.

The electron transport layer 235 may be formed on the light emission layer 234 and above a front side of the substrate 200 by using an open mask. Although not illustrated in FIG. 2, a hole blocking layer may be selectively formed between the light emission layer 234 and the electron transport layer 235 by using a hole blocking layer forming material. The electron injection layer 236 may be formed on the electron transport layer 235 and above the front side of the substrate 200 by using the open mask.

In the second example embodiment shown in FIG. 2, the second electrode 240 is formed on the electron injection layer 236. The second electrode 240 may be formed as a common electrode that extends over the R, G, and B sub-pixels and connects the R, G, and B sub-pixels.

Figure 3:
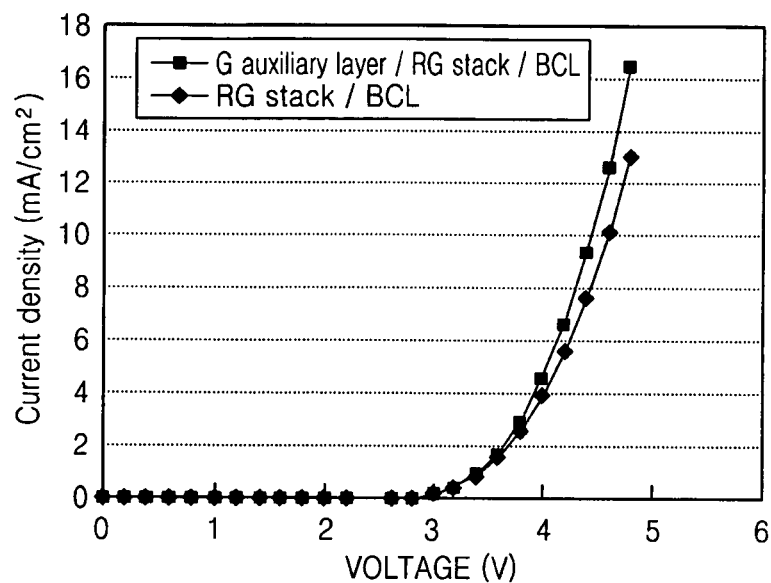
FIGS. 3 and 4 illustrate a voltage-current graph and a current efficiency-brightness graph, respectively, of an organic light emitting diode (OLED) according to one or more embodiments, and a comparative example of an OLED.
Figure 4:
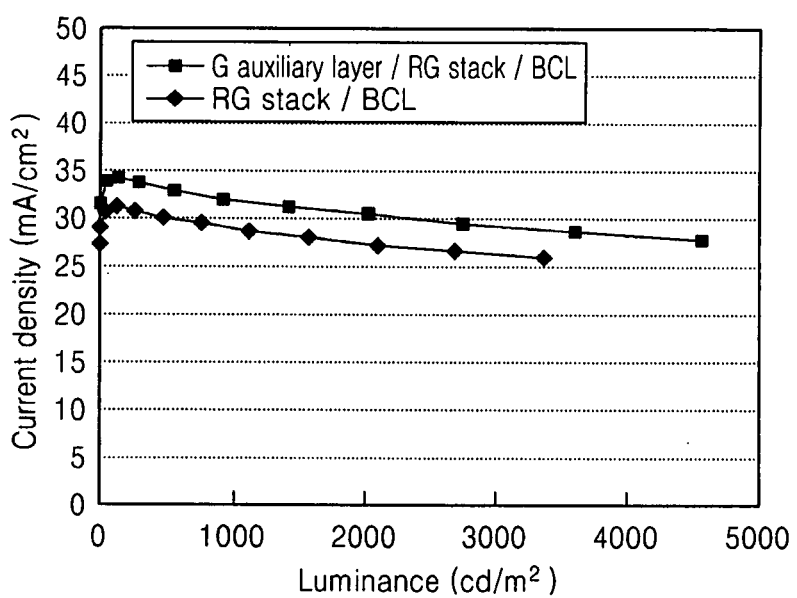

FIGS. 3 and 4 illustrate a voltage-current graph and a current efficiency-brightness graph, respectively, of an organic light emitting diode (OLED) according to one or more embodiments, and a comparative example of an OLED.

FIGS. 3 and 4 illustrate data corresponding to the second example embodiment shown FIG. 2, which has a structure in which a red light emission layer and a green light emission layer are formed as a stack structure (RG stack), and a blue light emission layer is arranged as a blue common layer (BCL), and data of the comparative example in which a green auxiliary layer (G auxiliary layer) is added to a structure having an RG stack and a BCL.

Referring to FIGS. 3 and 4, the RG stack OLED manufactured according to the one or more embodiments may provide a highly efficient, superior, and stable device that requires a low driving voltage, has a small color change due to an increase of brightness, and does not sharply deteriorate after a long driving. Red light emission occurs in the red sub-pixel by using the red light emission layer, and the red light emission layer is used as the G auxiliary layer in a green sub-pixel so that there is no considerable difference in efficiency and voltage, compared to the comparative example having the separate G auxiliary layer. Accordingly, it is possible to simplify a manufacturing process.

FIGS. 5(a)-(d) illustrate pattern types of a color filter that may be applied to an OLED according to the one or more embodiments.

Figure 5:
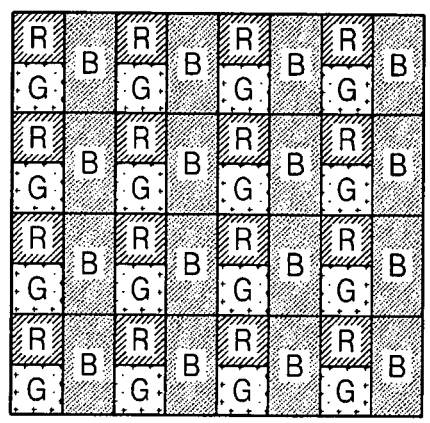
FIGS. 5(a)-(d) illustrate pattern types of a color filter that may be applied to an OLED according to the one or more embodiments.
Figure 5:
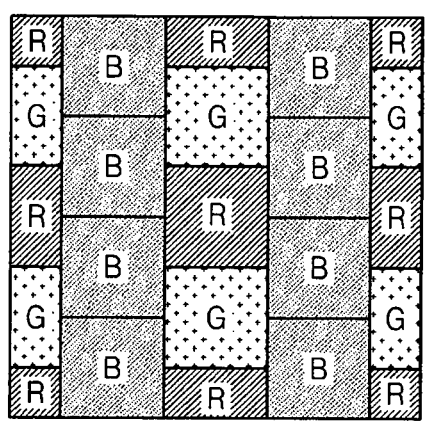
Figure 5:
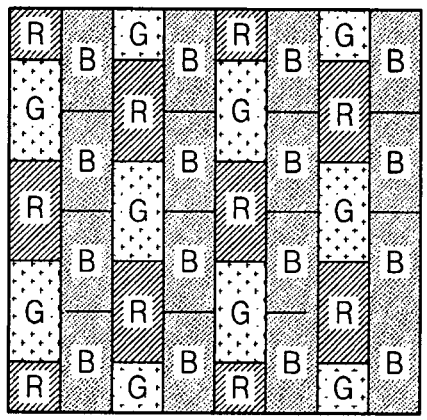
Figure 5:
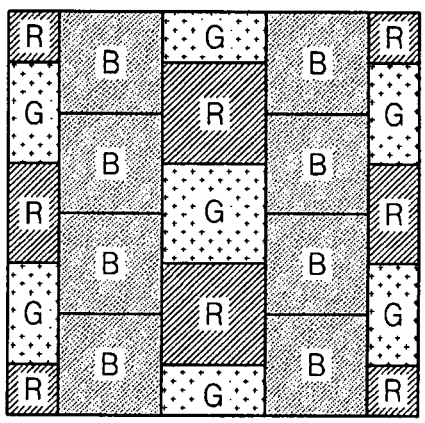

Referring to FIG. 5, in the OLED display of one or more embodiments, the red light emission layer and the green light emission layer may be stacked so that red and green filter patterns may be adjacent as illustrated in FIGS. 5 (a) through (d).

In a general OLED display formed according to the color filter method, efficiency of an emitted white light decreases while passing through a color filter, and thus a highly efficient white light emitting material is required, and an overall efficiency is low, compared to a fine patterning method using a metal shadow mask. Further, with regard to the independent light emission method that involves depositing and patterning the R, G, and B light emitting materials by using a fine metal shadow mask, it is difficult to enlarge an organic light emission panel due to difficulties in manufacturing the fine metal shadow mask when the size and resolution of a display are increased. Also, in order to deposit an auxiliary layer and the R, G, and B light emitting materials, elaborate alignment equipment may be needed. In this regard, when a pixel of a thin film transistor (TFT) substrate and the fine metal shadow mask are aligned, a defective pixel may be formed by damaging organic materials that were previously deposited. Also, a large fine metal shadow mask is difficult to manufacture and very expensive, imposing limits on use of the large fine metal shadow mask.

In contrast, the method of manufacturing the OLED display according to the one or more embodiments may reduce the number of times of using the FMM, thereby providing a simple process and decreasing manufacturing costs, as compared to a general R, G, and B independent patterning method. One or more embodiments may provide a method that reduces the number of times a fine metal mask (FMM) is used by stacking a red light emission layer and a green light emission layer which have an improved lifetime characteristic and light emission efficiency, when manufacturing an organic light emitting diode (OLED) display having a front and rear surface resonance structure with independent light emission. An OLED display according to the one or more embodiments may provide a highly efficient, superior, and stable device that requires a low driving voltage, has a small color change due to an increase of brightness, and does not sharply deteriorate after a long driving. The OLED display may have an improved lifetime and light emission efficiency while reducing the number of times of changing a fine metal mask (FMM) during the manufacture thereof.

Although it is described in the exemplary embodiment that an OLED display is formed by using RGB sub-pixels, embodiments are not limited to this embodiment. That is, an OLED display may form full white by RGB colors, or other colors, for example, orange and cyan.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:
1. An organic light emitting device display, comprising:
   a first electrode in red, green, and blue sub-pixels on a substrate;
   a hole injection layer above the substrate so as to cover the first electrode;
   a hole transport layer above the hole injection layer;
   an auxiliary layer between the hole injection layer and the hole transport layer in the red sub-pixel;
   a red light emission layer and a green light emission layer above the hole transport layer in the red sub-pixel and the green sub-pixel, the red light emission layer being between the green light emission layer and the hole transport layer; and
   a blue light emission layer above the hole transport layer in the blue sub-pixel,
   the red light emission layer and the green light emission layer being co-extensive and the blue light emission layer not overlapping the red light emission layer or the green light emission layer.
2. The organic light emitting device display as claimed in claim 1, wherein the red light emission layer has a hole transport ability, and the green light emission layer has an electron transport ability.
3. The organic light emitting device display as claimed in claim 1, wherein the auxiliary layer has a hole transport ability.
4. The organic light emitting device display as claimed in claim 3, wherein the auxiliary layer includes the same material as the hole transport layer.
5. The organic light emitting device display as claimed in claim 1, wherein the thickness of the auxiliary layer is between about 300 Å and about 1,500 Å.
6. The organic light emitting device display as claimed in claim 1, wherein the thickness of the red light emission layer is between about 500 Å and about 2,000 Å, and the thickness of the green light emission layer is between about 100 Å and about 1,000 Å.
7. A method of manufacturing an organic light emitting device display, the method comprising:
   forming a first electrode for each of red, green, and blue sub-pixels on a substrate;
   forming a hole injection layer above the substrate so as to cover the first electrode;
   forming an auxiliary layer above the hole injection layer in the red sub-pixel;
   forming a hole transport layer above the hole injection layer so as to cover the auxiliary layer;
   sequentially forming a red light emission layer and a green light emission layer to be co-extensive above the hole transport layer in the red sub-pixel and the green sub-pixel, and
   forming a blue light emission layer on the hole transport layer in the blue sub-pixel, the blue light emission layer not overlapping the red light emission layer or the green light emission layer.
8. The method as claimed in claim 7, wherein the red light emission layer has a hole transport ability, and the green light emission layer has an electron transport ability.
9. The method as claimed in claim 8, wherein the auxiliary layer has a hole transport ability.
10. The method as claimed in claim 9, wherein the auxiliary layer includes the same material as the hole transport layer.
11. The method as claimed in claim 7, wherein the thickness of the auxiliary layer is between about 300 Å and about 1,500 Å.
12. The method as claimed in claim 7, wherein the thickness of the red light emission layer is between about 500 Å and about 2,000 Å, and the thickness of the green light emission layer is between about 100 Å and about 1,000 Å.
13. The method as claimed in claim 7, wherein the blue light emission layer is formed by being patterned by using a fine metal mask.
14. The method as claimed in claim 7, wherein the auxiliary layer, the red light emission layer, and the green light emission layer are formed by being patterned by using a fine metal mask.

* * * * *